United States Patent
Liu et al.

(10) Patent No.: US 8,999,106 B2
(45) Date of Patent: Apr. 7, 2015

(54) APPARATUS AND METHOD FOR CONTROLLING EDGE PERFORMANCE IN AN INDUCTIVELY COUPLED PLASMA CHAMBER

(75) Inventors: Wei Liu, San Jose, CA (US); Johanes F. Swenberg, Los Gatos, CA (US); Hanh D. Nguyen, San Jose, CA (US); Son T. Nguyen, San Jose, CA (US); Roger Curtis, Stockton, CA (US); Philip A. Bottini, Santa Clara, CA (US); Michael J. Mark, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 920 days.

(21) Appl. No.: 11/960,300

(22) Filed: Dec. 19, 2007

(65) Prior Publication Data
US 2009/0162952 A1 Jun. 25, 2009

(51) Int. Cl.
| | |
|---|---|
| *C23C 16/50* | (2006.01) |
| *C23C 16/00* | (2006.01) |
| *C23F 1/00* | (2006.01) |
| *H01L 21/306* | (2006.01) |
| *H01L 21/687* | (2006.01) |
| *H01J 37/32* | (2006.01) |
| *H01L 21/67* | (2006.01) |

(52) U.S. Cl.
CPC ......... *H01L 21/68742* (2013.01); *H01J 37/321* (2013.01); *H01J 37/32623* (2013.01); *H01L 21/67069* (2013.01); *H01L 21/68735* (2013.01)

(58) Field of Classification Search
USPC .................. 118/728, 729, 730, 731, 732; 156/345.51, 345.52, 345.53, 345.54, 156/345.55

See application file for complete search history.

(56) References Cited

U.S. PATENT DOCUMENTS

| | | | |
|---|---|---|---|
| 4,512,841 | A | 4/1985 | Cunningham, Jr. et al. |
| 5,110,407 | A | 5/1992 | Ono et al. |
| 5,445,709 | A | 8/1995 | Kojima et al. |

(Continued)

FOREIGN PATENT DOCUMENTS

| | | |
|---|---|---|
| EP | 0 818 558 | 1/1998 |
| EP | 1 106 715 | 6/2001 |

(Continued)

OTHER PUBLICATIONS

PCT International Search Report and Written Opinion dated May 26, 2009 for International Application No. PCT/US2008/086885.

(Continued)

*Primary Examiner* — Parviz Hassanzadeh
*Assistant Examiner* — Tiffany Nuckols
(74) *Attorney, Agent, or Firm* — Patterson & Sheridan, LLP

(57) ABSTRACT

The present invention generally provides methods and apparatus for controlling edge performance during process. One embodiment of the present invention provides an apparatus comprising a chamber body defining a process volume, a gas inlet configured to flow a process gas into the process volume, and a supporting pedestal disposed in the process volume. The supporting pedestal comprises a top plate having a substrate supporting surface configured to receive and support the substrate on a backside, and an edge surface configured to circumscribe the substrate along an outer edge of the substrate, and a height difference between a top surface of the substrate and the edge surface is used to control exposure of an edge region of the substrate to the process gas.

17 Claims, 7 Drawing Sheets

(56) References Cited

U.S. PATENT DOCUMENTS

| | | | |
|---|---|---|---|
| 5,556,476 A * | 9/1996 | Lei et al. | 118/728 |
| 5,584,936 A * | 12/1996 | Pickering et al. | 118/728 |
| 5,660,673 A | 8/1997 | Miyoshi | |
| 5,683,518 A | 11/1997 | Moore et al. | |
| 5,700,725 A | 12/1997 | Hower et al. | |
| 5,803,977 A * | 9/1998 | Tepman et al. | 118/728 |
| 5,824,607 A * | 10/1998 | Trow et al. | 438/732 |
| 5,848,889 A | 12/1998 | Tietz et al. | |
| 5,882,419 A | 3/1999 | Sinha et al. | |
| 5,888,413 A | 3/1999 | Okumura et al. | |
| 5,920,797 A | 7/1999 | Ballance et al. | |
| 5,972,116 A * | 10/1999 | Takagi | 118/719 |
| 5,975,013 A | 11/1999 | Holland et al. | |
| 6,054,013 A | 4/2000 | Collins et al. | |
| 6,095,083 A | 8/2000 | Rice et al. | |
| 6,133,152 A | 10/2000 | Bierman et al. | |
| 6,143,086 A * | 11/2000 | Tepman | 118/728 |
| 6,159,299 A | 12/2000 | Koai et al. | |
| 6,176,198 B1 | 1/2001 | Kao et al. | |
| 6,229,264 B1 | 5/2001 | Ni et al. | |
| 6,231,674 B1 | 5/2001 | Chen et al. | |
| 6,280,183 B1 | 8/2001 | Mayur et al. | |
| 6,315,878 B1 * | 11/2001 | Patadia et al. | 204/298.15 |
| 6,344,105 B1 | 2/2002 | Daugherty et al. | |
| 6,344,631 B1 | 2/2002 | Chacin | |
| 6,350,320 B1 | 2/2002 | Sherstinsky et al. | |
| 6,383,931 B1 | 5/2002 | Flanner et al. | |
| 6,414,648 B1 | 7/2002 | Holland et al. | |
| 6,464,794 B1 | 10/2002 | Park et al. | |
| 6,497,767 B1 | 12/2002 | Okase et al. | |
| 6,589,352 B1 | 7/2003 | Yudovsky et al. | |
| 6,623,597 B1 | 9/2003 | Han et al. | |
| 6,840,767 B2 * | 1/2005 | Goodman | 432/253 |
| 6,887,317 B2 * | 5/2005 | Or et al. | 118/728 |
| 7,024,105 B2 | 4/2006 | Fodor et al. | |
| 7,033,444 B1 | 4/2006 | Komino et al. | |
| 7,252,738 B2 | 8/2007 | Tong et al. | |
| 7,504,041 B2 | 3/2009 | Chandrachood et al. | |
| 2002/0066727 A1 | 6/2002 | Park | |
| 2003/0013315 A1 | 1/2003 | Park et al. | |
| 2003/0044529 A1 | 3/2003 | Wu et al. | |
| 2003/0070620 A1 | 4/2003 | Cooperberg et al. | |
| 2004/0083971 A1 | 5/2004 | Holland et al. | |
| 2004/0154544 A1 * | 8/2004 | Strauch | 118/728 |
| 2004/0163764 A1 | 8/2004 | Collins et al. | |
| 2004/0242021 A1 | 12/2004 | Kraus et al. | |
| 2005/0078953 A1 | 4/2005 | Fodor et al. | |
| 2006/0029747 A1 | 2/2006 | Cruse et al. | |
| 2007/0187363 A1 | 8/2007 | Oka et al. | |
| 2007/0256784 A1 | 11/2007 | Chandrachood et al. | |
| 2007/0256787 A1 | 11/2007 | Chandrachood et al. | |
| 2007/0257008 A1 | 11/2007 | Chandrachood et al. | |
| 2007/0257009 A1 | 11/2007 | Chandrachood et al. | |

FOREIGN PATENT DOCUMENTS

| | | |
|---|---|---|
| EP | 1 199 380 | 4/2002 |
| JP | 08-111297 | 4/1996 |
| JP | 10280173 A | 10/1998 |
| JP | 2004-207573 | 7/2004 |
| JP | 2005142529 A | 6/2005 |
| JP | 05057840 B2 | 10/2012 |
| KR | 10 2002-0043766 | 6/2002 |
| KR | 10 2004-0033831 | 4/2004 |
| WO | WO-2005038081 A2 | 4/2005 |

OTHER PUBLICATIONS

Japanese Office Action for JP Application No. 2010-539685 dated Mar. 26, 2013.

First Office Action dated Sep. 2011 for Chinese Patent Application No. 200880117690.1.

* cited by examiner

APPARATUS AND METHOD FOR CONTROLLING EDGE PERFORMANCE IN AN INDUCTIVELY COUPLED PLASMA CHAMBER

BACKGROUND OF THE INVENTION

1. Field of the Invention

Embodiments of the present invention generally relate to methods and apparatus for processing a semiconductor substrate. More particularly, embodiments of the present invention provide methods and apparatus for processing a semiconductor substrate using inductively coupled plasma technology with improved uniformity.

2. Description of the Related Art

Plasma reactors used to fabricate semiconductor microelectronic circuits can employ RF (radio frequency) inductively coupled fields to maintain a plasma formed from a processing gas. Conventional inductively coupled plasma reactors generally includes a vacuum chamber having a side wall and a ceiling, a workpiece support pedestal within the chamber and generally facing the ceiling, a gas inlet capable of supplying a process gas into the chamber, and one or more coil antennas overlying the ceiling. The one or more coil antennas are generally wound about an axis of symmetry generally perpendicular to the ceiling. A RF plasma source power supply is connected across each of the coil antennas. Sometimes, the reactor may include an inner coil antenna overlying the ceiling and surrounded by an outer coil antenna.

Typically, a high frequency RF source power signal is applied to the one or more coil antennas near the reactor chamber ceiling. A substrate disposed on a pedestal within the chamber which may have a bias RF signal applied to it. The power of the signal applied to the coil antenna primarily determines the plasma ion density within the chamber, while the power of the bias signal applied to the substrate determines the ion energy at the wafer surface.

Typically with "inner" and "outer" coil antennas, the coils are distributed radially or horizontally (rather than being confined to a discrete radius) so that their radial location is diffused accordingly. The radial distribution of plasma ion distribution is changed by changing the relative apportionment of applied RF power between the inner and outer antennas. However, it becomes more difficult to maintain a uniform plasma ion density across the entire wafer surface as wafers become larger.

FIG. 1 schematically illustrates non-uniformity problems near the edge of a substrate encountered by typical inductively coupled plasma reactors. FIG. 1 shows nitrogen dosages across a substrate after a nitridation process preformed in a typical inductively coupled plasma reactor. The nitridation process is performed on a silicon dioxide gate dielectric film formed on a substrate. The substrate is positioned in a vacuum chamber capable of generating inductively coupled plasma. Nitrogen gas is flown to the plasma chamber and a plasma is struck while the flow continues. The nitrogen radicals and/or nitrogen ions in the nitrogen plasma then diffuse and/or bombard into the silicon dioxide gate dielectric film.

FIG. 1 is a diameter scan chart showing nitrogen dosage (Ndose) across a diameter of an entire surface of a 300 mm substrate after nitridation is performed in an inductively coupled plasma reactor. The diameter scan chart in FIG. 1 illustrates one of the non-uniformity problem—low dosage near the edge area, generally known as edge-drop. It is desirable to reduce edge drop in typical situations to achieve uniformity across the substrate. Sometimes, it is desirable to have the edge performance tuned, high or low, to satisfy specific needs.

Therefore, there is a need for apparatus and method for processing a semiconductor substrate using inductively coupled plasma technology with capability to control the edge performance.

SUMMARY OF THE INVENTION

The present invention generally provides method and apparatus for controlling edge process performance on substrate during process.

One embodiment of the present invention provides an apparatus for processing a substrate comprising a chamber body defining a process volume, a gas inlet configured to flow a process gas into the process volume, and a supporting pedestal disposed in the process volume, wherein the supporting pedestal comprises a top plate having a substrate supporting surface configured to receive and support the substrate on a backside, and an edge surface configured to circumscribe the substrate along an outer edge of the substrate, wherein a height difference between a top surface of the substrate and the edge surface is used to control exposure of an edge region of the substrate to the process gas.

Another embodiment of the present invention provides a top plate for a supporting pedestal in a process chamber comprising a body having substantially a plate shape, wherein the body has a substrate supporting surface configured to receive and support a substrate on a backside, and an edge surface configured to circumscribe the substrate along an outer edge of the substrate, wherein a height difference between a top surface of the substrate and the edge surface is designed to achieve a desired exposure of an edge region of the substrate to a process gas flown in the process chamber.

Yet another embodiment of the present invention provides a method for adjusting an edge processing performance comprising providing a supporting pedestal in a process chamber, wherein the supporting pedestal has a substrate supporting surface configured to receive and support a substrate thereon, and an edge surface configured to circumscribe the substrate along an outer edge of the substrate, positioning a substrate on the substrate pedestal, flowing a process gas to the process chamber, and processing the substrate with the process gas, wherein a height difference between a top surface of the substrate and the edge surface is used to control exposure of an edge region of the substrate to the process gas flown to the process chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally provides apparatus and methods for processing a semiconductor substrate using inductively coupled plasma. Embodiments of the present invention provide inductively coupled plasma reactors having features that provide improved uniformity. Particularly, the inductively coupled plasma reactors of the present invention comprises a substrate support assembly capable of tune edge performance profile.

Figure 1:
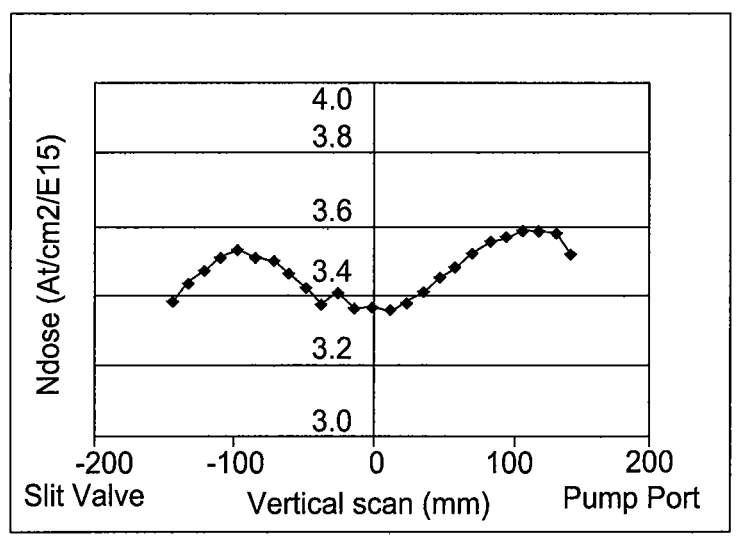
FIG. 1 (prior art) schematically illustrate a non-uniformity problem known as edge drop encountered by typical inductively coupled plasma reactors.
Figure 2:
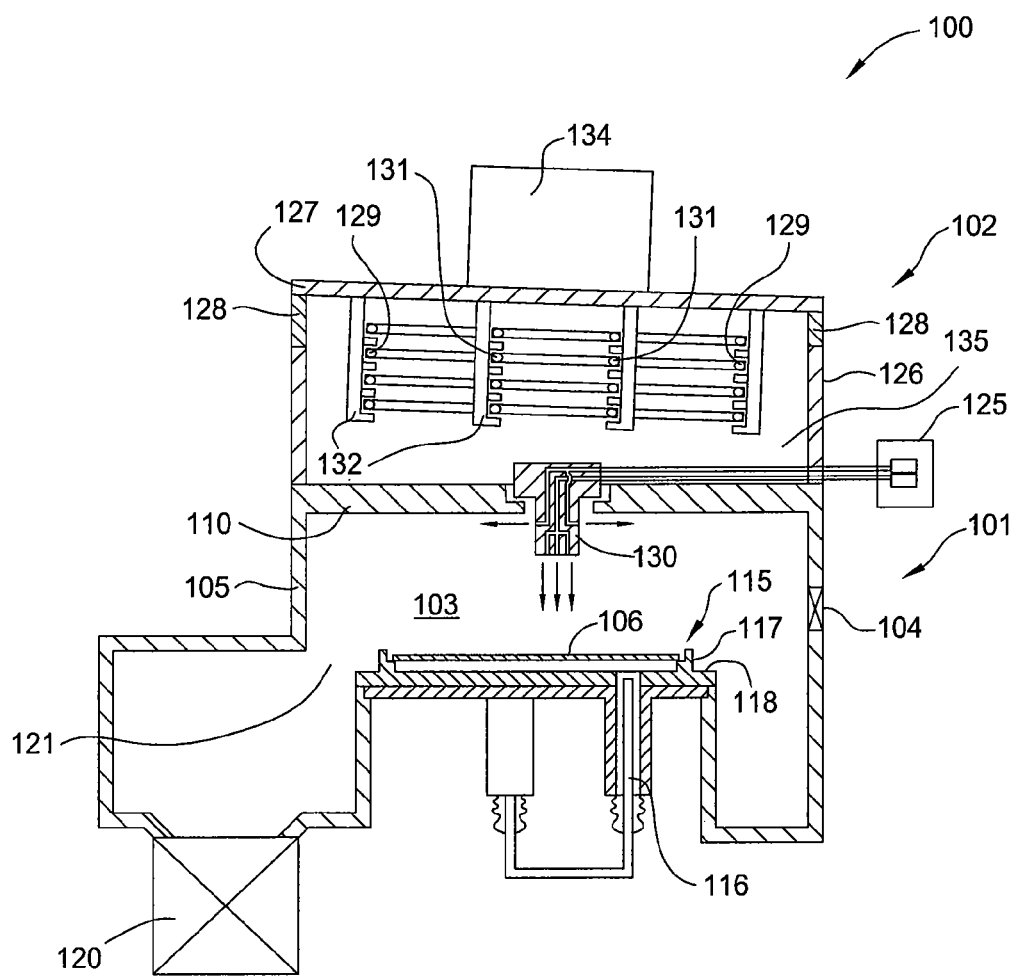
FIG. 2 schematically illustrates a sectional side view of a plasma reactor in accordance with one embodiment of the present invention.

FIG. 2 schematically illustrates a sectional side view of a plasma reactor 100 in accordance with one embodiment of the present invention. The plasma reactor 100 generally comprises a reactor chamber 101 and an antenna assembly 102 positioned above the reactor chamber 101. The antenna assembly 102 is configured to generate inductively coupled plasma in the reactor chamber 101.

The reactor chamber 101 has a process volume 103 defined by a cylindrical side wall 105 and a flat ceiling 110. A substrate supporting pedestal 115 is disposed within the reactor chamber 101, oriented in facing relationship to the flat ceiling 110 and centered on the chamber axis of symmetry. The substrate supporting pedestal 115 is configured to support a substrate 106 thereon. The substrate supporting pedestal 115 comprises a supporting body 117 configured to receive and support the substrate 106 during process. In one embodiment, the substrate supporting pedestal 115 has an edge surface 118 circumscribing the substrate 106. The relative height between the edge surface 118 and the substrate 106 is configured to adjust processing results near the edge of the substrate 106.

A plurality of supporting pins 116 are movably disposed on the substrate supporting pedestal 115 and are configured to facilitate substrate transporting. A vacuum pump 120 cooperates with a vacuum port 121 of the reactor chamber 101. A slit valve port 104 is formed on the cylindrical side wall 105 allowing transporting of substrates in and out of the process volume 103.

A process gas supply 125 furnishes process gas into the process volume 103 through a gas inlet 130. The gas inlet 130 may be centered on the flat ceiling 110 and has a plurality of gas inject ports directing gas to different regions of the process volume 103. In one embodiment, the gas inlet 130 may be configured to supply individually adjustable flow of process gas to different regions of the process volume 103 to achieve desired distribution of process gas within the process volume 103.

The antenna assembly 102 comprises a cylindrical side wall 126 disposed on the flat ceiling 110 of the reactor chamber. A coil mounting plate 127 is movably disposed on the side wall 126. The side wall 126, the coil mounting plate 127, and the flat ceiling 110 generally define a coil volume 135. A plurality of coil hangers 132 extend from the coil mounting plate 127 in the coil volume 135. The plurality of coil hangers 132 are configured to position one or more coil antennas in the coil volume 135.

In one embodiment, an inner coil 131 and an outer coil 129 are arranged in the coil volume 135 to maintain a uniform plasma ion density across the entire substrate surface during process. In one embodiment, the inner coil 131 has a diameter of about 5 inches and the outer coil 129 has a diameter of about 15 inches. Detailed description of different designs of coil antennas may be found in U.S. Pat. No. 6,685,798, entitled "Plasma Reactor Having a Symmetric Parallel Conductor Coil Antenna", which is incorporated herein by reference.

Each of the inner coil 131 and the outer coil 129 may be a solenoidal multi-conductor interleaved coil antenna that defines a vertical right circular cylinder or imaginary cylindrical surface or locus whose axis of symmetry substantially coincides with that of the reactor chamber 101. It is desirable to have axis of the inner coil 131 and outer coil 129 to coincide with the axis of the axis of symmetry of the substrate 106 to be processed in the reactor chamber 101. However, the alignment among the inner coil 131, the outer coil 129, the reactor chamber 101, and the substrate 106 is susceptible to errors causing skews. The coil mounting plate 127 is movably positioned on the side walls 126 so that the inner coil 131 and the outer coil 129 may be tilted relative to the reactor chamber 101, together or independently. In one embodiment, the coil mounting plate 127 may be adjusted rotating a tilt ring 128 positioned between the coil mounting plate 127 and the side wall 126. The tilt ring 128 has a variable thickness which enables a tilted mounting of the coil mounting plate 127.

The plasma reactor 100 further comprises a power assembly 134 configured to provide power supply to the inner coil 131 and the outer coil 129. The power assembly 134 generally comprises RF power supplies and matching networks. In one embodiment, the power assembly 134 may be positioned above the coil mounting plate 127.

More detailed description of the plasma reactor 100 may be found in U.S. patent application Ser. No. 11/960,111, filed Dec. 19, 2007, entitled "Apparatus and Method for Processing a Substrate Using Inductively Coupled Plasma Technology", which is incorporated herein by reference.

Figure 3A:
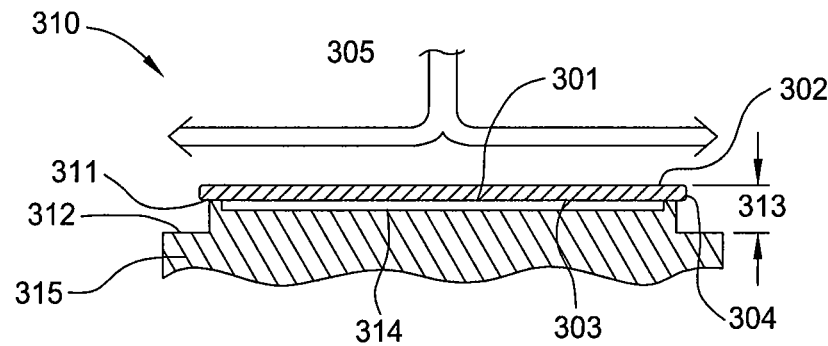
FIG. 3A schematically illustrates a partial side view of a top plate of a supporting pedestal in accordance with one embodiment of the present invention.

FIG. 3A schematically illustrates a partial side view of a top plate 310 of a supporting pedestal, for example, the substrate supporting pedestal 115 of FIG. 2, in accordance with one embodiment of the present invention.

The top plate 310 comprises a body 315 which has a substrate supporting surface 311 configured to support a backside 303 of a substrate 301. The top plate 310 is configured to receive and support the substrate 301 on the substrate supporting surface 311 so that a device side 302 of the substrate 301 is exposed to a flow of process gas 305. In one embodiment, the flow of process gas 305 may be struck by a radio frequency source and comprise radicals therein. In one embodiment, a recess 314 is formed in the body 315 with in the substrate supporting surface 311 to reduce contact area between the top plate 310 and the substrate 301. As a result, the substrate supporting surface 311 may have a ring shape and support a band of area near an edge 304 of the substrate 301. In one embodiment, the top plate 310 is designed to leave the edge 304 of the substrate 301 hanging free.

The top plate 310 also has an edge surface 312 which is radially outside the substrate supporting surface 311 and is configured to circumscribe the substrate 301. In one embodiment, a height difference 313 between the edge surface 312 and the device side 302 of the substrate 301 is designed to control an edge performance of a process being run, particularly, the height difference 313 is used to control the exposure of the edge 304 to the process gas 305 during process. As a result, the height difference 313 may be used to control performance within a region about 10 mm from the edge 304.

Figure 3B:
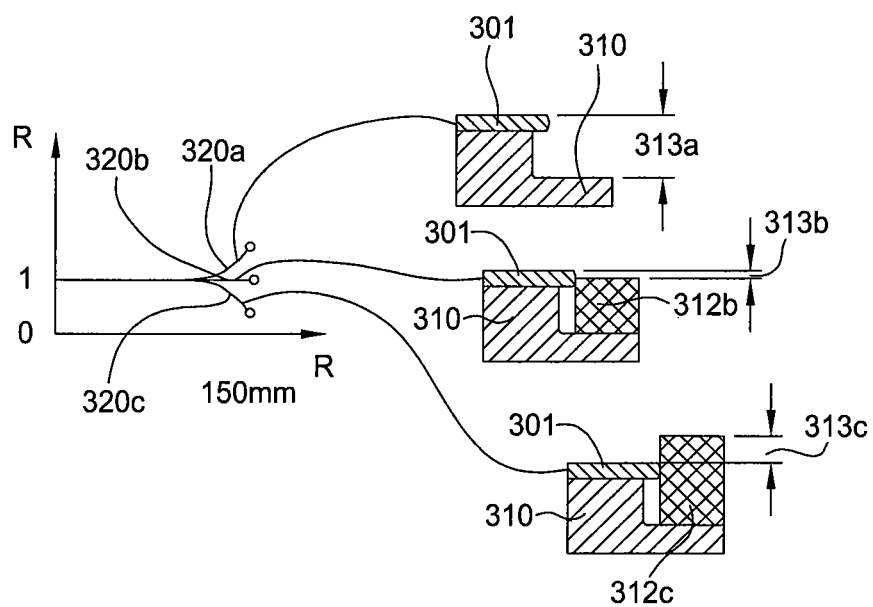
FIG. 3B schematically illustrates controlling of edge performance using high differences between an edge surface and a top surface of a substrate being processed in accordance with one embodiment of the present invention.

FIG. 3B schematically illustrates controlling of edge performances using height differences between an edge surface and a top surface of a substrate being processed in accordance with one embodiment of the present invention. FIG. 3B illustrates performance profiles 320a, 320b, 320c of normalized process results along a radius of a substrate being processed. The process results may refer to different parameters for different processes, for example dosage for a doping process, thickness for deposition, and strength of bombardment for plasma etching.

Profile 320a is an edge intense performance, indicating that the edge region of the substrate receives more exposure to the processing gas/plasma compared to center portion of the substrate. In one embodiment of the present invention, a positive height difference 313a between a top surface of the substrate 301 and the edge surface of the top plate 310 is used to achieve an edge performance similar to 320a.

Profile 320b is an edge flat performance, indicating that the edge region of the substrate receives similar exposure to the processing gas/plasma compared to center portion of the substrate. In one embodiment of the present invention, a small positive height difference 313b between a top surface of the substrate 301 and the edge surface to achieve an edge performance similar to 320b. In one embodiment, an edge ring 312b of desired thickness may be disposed on the top plate 310 to get the small positive height difference 313b. In one embodiment, the small positive height difference may be less than about 0.5 inch.

Profile 320c is an edge weak performance, indicating that the edge region of the substrate receives less exposure to the processing gas/plasma compared to center portion of the substrate. In one embodiment of the present invention, a negative height difference 313c between a top surface of the substrate 301 and the edge surface is used to achieve an edge performance similar to 320c. In one embodiment, an edge ring 312c of desired thickness may be disposed on the top plate 310 to get the small positive height difference 313c.

Figure 4:
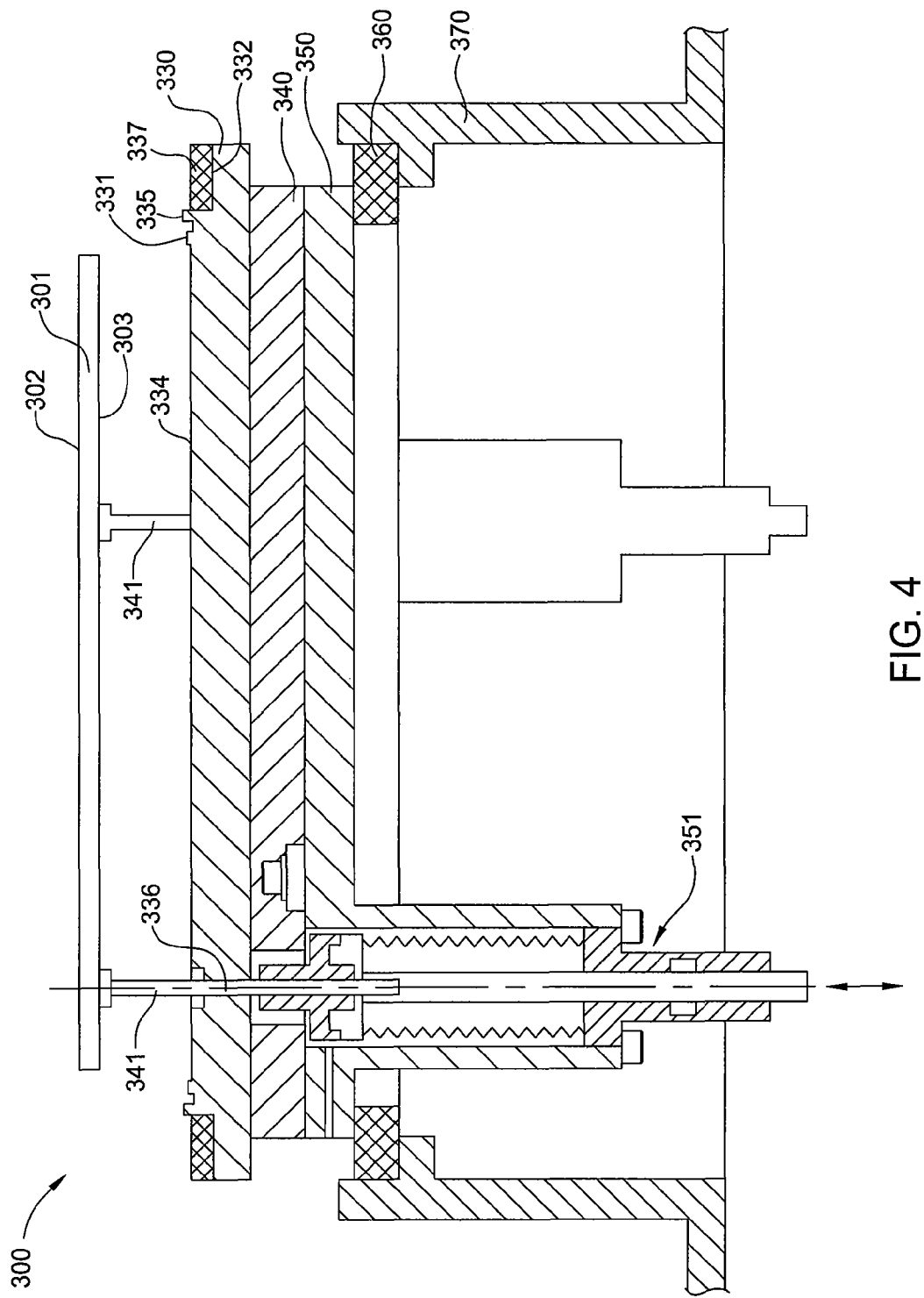
FIG. 4 schematically illustrates a sectional side view of a supporting pedestal in accordance with one embodiment of the present invention.

FIG. 4 schematically illustrates a sectional side view of a supporting pedestal 300 in accordance with one embodiment of the present invention. The supporting pedestal 300 is configured to receive and support a substrate in a process chamber, such as the plasma reactor 100 of FIG. 2.

The supporting pedestal 300 comprises a top plate 330 having a substrate supporting surface 331 configured to receive and support the backside 303 of the substrate 301. The top plate 330 is stacked on a facility plate 350 via an adaptor plate 340. The stack of the top plate 330, the adaptor plate 340 and the facility plate 350 is then coupled to a chamber body 370 (partially shown) via an adaptor 360 so that the top plate 330 is sealably disposed in a process volume defined by the chamber body 370.

The facility plate 350 is configured to accommodate a plurality of driving mechanism 351, which is configured to raise and lower a plurality of lifting pins 341. The plurality of lifting pins 341 is movably disposed in a plurality of pin holes 336 formed in the top plate 330. The plurality of lifting pins 341 may be raised above the top plate 330, as shown in FIG. 4, to facilitate substrate transferring with a substrate handler, for example, a robot. The after receiving the substrate 301, the plurality of lifting pins 341 may be lowered by the plurality of driving mechanism 351 to rest under the substrate supporting surface 331 in the plurality of pin holes 336 and dispose the substrate 301 on the substrate supporting surface 331.

The top plate 330 has a body of a disk shape. In one embodiment, the top plate 330 may be made of quartz and/or the body 315 of the plate 330 may be manufactured from quartz. The top plate 330 is configured to receive and support the substrate 301 on the substrate supporting surface 311 so that a device side 302 of the substrate 301 is exposed to a flow of process gas in the process volume.

Figure 5A:
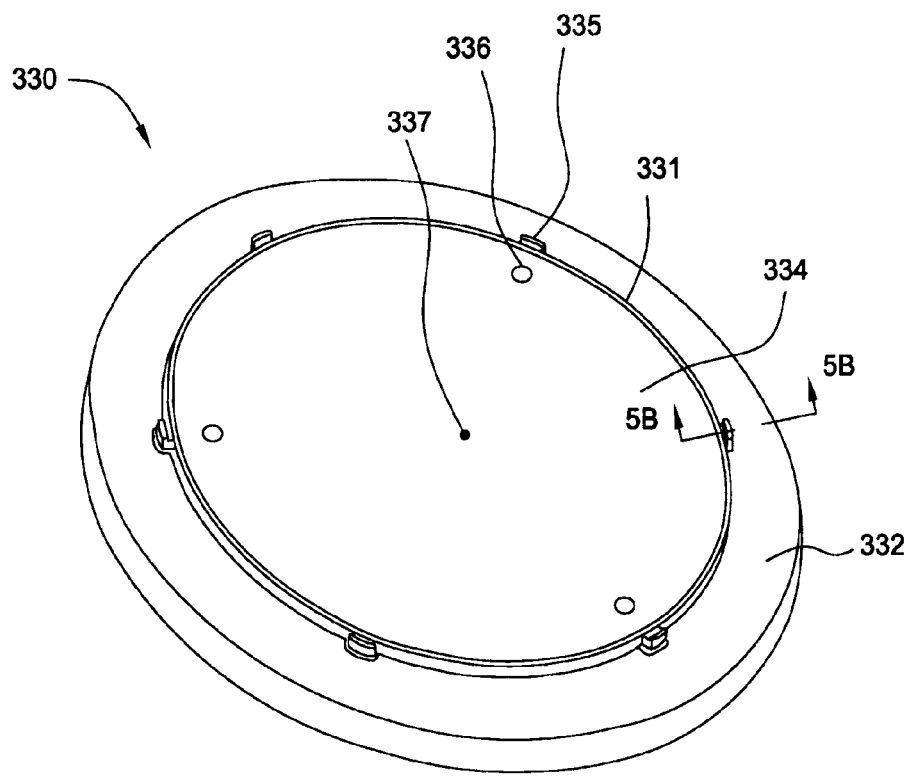
FIG. 5A schematically illustrates a top plate of the supporting pedestal of FIG. 4.
Figure 5B:
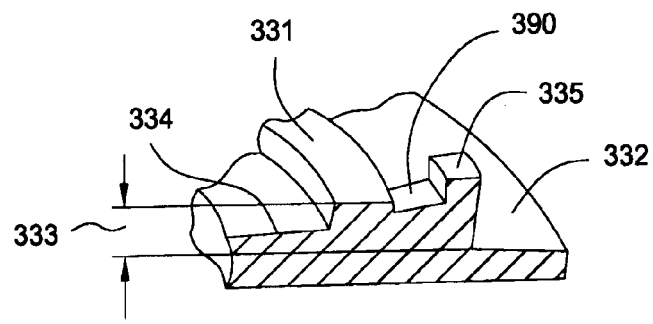
FIG. 5B schematically illustrates a partial side view of the top plate of FIG. 5A.

FIG. 5A schematically illustrates one embodiment of the top plate 330 and FIG. 5B schematically illustrates a partial side view of the top plate 330. In one embodiment, a recess 334 is formed within the substrate supporting surface 311 to reduce contact area between the top plate 330 and the substrate 301. As a result, the substrate supporting surface 331 may have a ring shape and support a band of area near the edge of the substrate 301.

The top plate 330 has a flange that forms an edge surface 332 which is radially outside the substrate supporting surface 331 and is configured to circumscribe the substrate 301. In one embodiment, a height difference 333 between the edge surface 332 and the substrate supporting surface 331 is designed to control an edge performance of a process being run, particularly, the height difference 333 is used to control the exposure of the edge of the substrate 301 to process chemistry during process.

In one embodiment, the height difference 333 is set so that the top surface of the substrate 301 is higher than the edge surface 332 by about 0.5 inch, or enough to achieve a uniform process performance across a radius of the substrate. In one embodiment, the height difference 333 may be about 0.25 inch.

In one embodiment, an optional edge ring 337 of desired thickness may be used to change the height of the edge surface to achieve a desired edge performance.

In one embodiment, a plurality of supporting island 335 protrude from the top plate 330 outside the substrate supporting surface 331. A groove 390 is formed between the substrate supporting surface 331 and each of the plurality of supporting islands 335. The plurality of supporting island 335 are higher than the substrate supporting surface 331 and are configured to prevent the substrate 301 from sliding away during processing.

In one embodiment, the plurality of lifting pins 341 may be used to adjust elevation of the substrate 301, thus adjusting height difference between the substrate 301 and the edge surface 332, during process.

In one embodiment, an aligning hole 338 is formed near a center of the top plate 330 and is configured to facilitate alignment of the top plate 330 during assembly. In one embodiment, referring to FIG. 4, each of the plurality of lifting pins 341 may have a mushroom shaped head to prevent the plurality of pin holes 336 from contaminating the process gas in the process volume. In one embodiment, the plurality of lifting pins 341 may be made from sapphire.

Figure 6A:
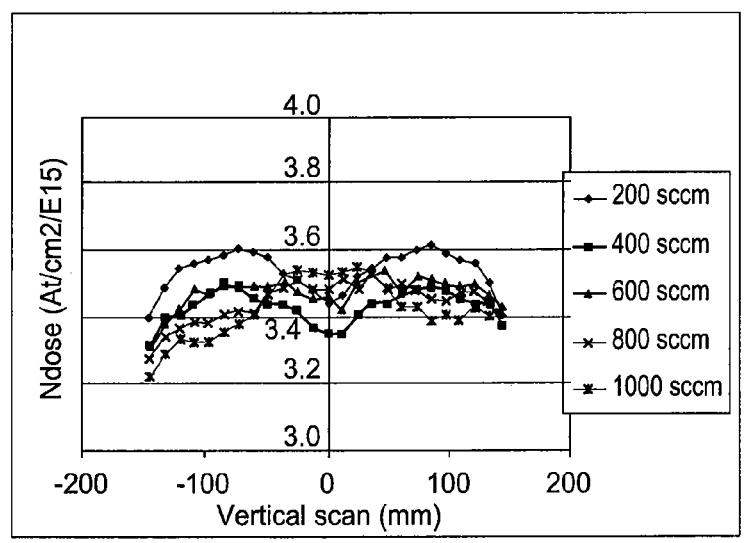
FIGS. 6A-6B are charts showing edge profiling controlling in accordance with one embodiment of the present invention.
Figure 6B:
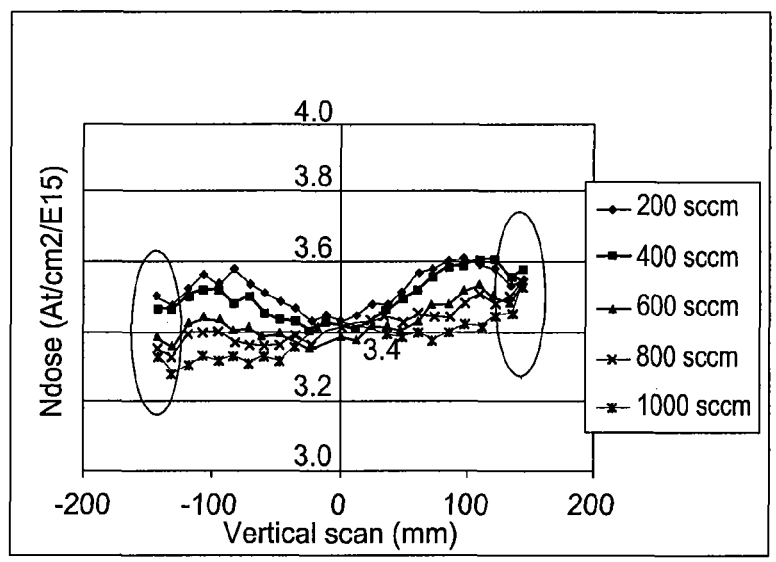

FIGS. 6A-6B are scanning charts showing edge profiling controlling in accordance with one embodiment of the present invention. FIGS. 6A-6B show nitrogen dosages across a diameter of a substrate after nitridation processes performed in the plasma reactor. The nitridation process is generally performed on a silicon dioxide gate dielectric film formed on a substrate. The substrate is positioned in the plasma reactor, for example, the plasma reactor 100 of FIG. 2. Nitrogen gas is flown to the plasma chamber and a plasma is struck by a coil assembly, such as the coils 129, 131 of FIG. 2, while the nitrogen flow is continuous. The plasma ionizes the nitrogen and the ionized nitrogen then diffuses into the silicon dioxide gate dielectric film.

FIG. 6A is a scanning chart showing nitrogen dosages across a diameter of a substrate after nitridation processes performed in the plasma reactor having a substrate support with an edge surface slightly higher than the top surface of the substrate being processed. FIG. 6A has dosage results from nitridation processes with nitrogen flow rates of 200 sccm, 400 sccm, 600 sccm, 800 sccm, and 1000 sccm. For all the results in FIG. 6A, the dosage near the edge of the substrate is substantially lower than the average dosage across the rest of the substrate.

FIG. 6B is a scanning chart showing nitrogen dosages across a diameter of a substrate after nitridation processes performed in the plasma reactor having a substrate support with an edge surface lower than the top surface of the substrate being processed. In these particular cases, the height difference between the edge surface and the top surface of the substrate is about 0.5 inch. FIG. 6B shows dosage results from nitridation processes with nitrogen flow rates of 200 sccm, 400 sccm, 600 sccm, 800 sccm, and 1000 sccm. Compared to the results in FIG. 6A, the results in FIG. 6B have increased dosage near the edge of the substrate. Moreover, results of FIG. 6B have edge dosages substantially close to the average dosage across the substrate.

It should be noted that the charts in FIGS. 6A-6B also show other non-uniformities, for example, low dosage near the center and asymmetry of dosage. The present invention is described in accordance with correction of edge-drop only.

The low dosages near the center of the substrate, showing in FIGS. 6A-6B, is due to flow distribution and correction of the low dosages near the center may be addressed by providing independent controllable flow to different regions of the substrate. Detailed description of correcting low dosages near the center may be found in U.S. patent application Ser. No. 11/960,166, filed Dec. 19, 2007, entitled "Dual Zone Gas Injection Nozzle", which is incorporated herein by reference.

The asymmetry of dosages across the substrate is generally referred to baseline skew. The correction of baseline skew may be achieved by adjusting coil assemblies relative to the substrate being processed. Detailed description of correcting baseline skew may be found in U.S. patent application Ser. No. 11/960,246, filed Dec. 19, 2007, entitled "Method of Correcting Baseline Skew by a Novel Motorized Source Coil Assembly", which is incorporated herein by reference.

While the foregoing is directed to embodiments of the present invention, other and further embodiments of the invention may be devised without departing from the basic scope thereof, and the scope thereof is determined by the claims that follow.

What is claimed is:

1. An apparatus for processing a substrate, comprising:
  a chamber body encompassing a process volume;
  a gas inlet configured to flow a process gas into the process volume; and
  a supporting pedestal disposed in the process volume, wherein the supporting pedestal comprises:
    a top plate having a substrate supporting surface, wherein the substrate supporting surface is a continuous ring, a recess on an upper surface of the top plate and circumscribed by the substrate supporting surface, and an edge surface circumscribing and extending radially outside of the substrate supporting surface;
    a plurality of supporting islands protruding from the top plate radially outward the substrate supporting surface, wherein the plurality of supporting islands extend vertically higher than the substrate supporting surface and an inner surface of each of the plurality of supporting islands is separated from an outer edge of the substrate supporting surface by a groove; and
    an edge ring disposed on the edge surface of the top plate and radially outward the plurality of supporting islands, wherein an upper surface of the substrate and an upper surface of the edge ring are disposed with a height difference between each other.

2. The apparatus of claim 1, wherein the substrate supporting surface has a smaller diameter than the substrate.

3. The apparatus of claim 2, wherein the edge surface is vertically lower than the upper surface of the substrate.

4. The apparatus of claim 3, wherein the height difference between the upper surface of the substrate and the edge surface is within a range from about 0.25 inch to about 0.5 inch.

5. The apparatus of claim 3, wherein the substrate supporting surface is an upper surface of the continuous ring and the continuous ring has a diameter smaller than a diameter of the substrate.

6. The apparatus of claim 3, further comprising a plurality of lifting pins disposed in a plurality of pin holes formed through the top plate.

7. The apparatus of claim 6, wherein each lift pin has a mushroom shaped head for preventing contamination.

8. The apparatus of claim 1, further comprising a plurality lifting pins configured to lift the substrate from the substrate supporting surface and to retract under the substrate supporting surface of the top plate.

9. The apparatus of claim 1, wherein the top plate comprises quartz.

10. The apparatus of claim 1, further comprising a plasma generator configured to provide an inductively coupled plasma within the process volume.

11. The apparatus of dam 1, wherein an inner surface of the edge ring surrounds outer surfaces of the plurality of the supporting islands.

12. A top plate for a supporting pedestal in a process chamber, comprising:
  a body having substantially a plate shape, wherein the body has a substrate supporting surface and the substrate supporting surface is a continuous ring, a recess on an upper surface of the top plate and circumscribed by the substrate supporting surface, and an edge surface circumscribing and extending radially outside of the substrate supporting surface;
  a plurality of supporting islands protruding from the body radially outward the substrate supporting surface, wherein the plurality of supporting islands extend vertically higher than the substrate supporting surface and an inner surface of each of the plurality of supporting islands is separated from an outer edge of the substrate supporting surface by a groove; and
  an edge ring disposed on the edge surface of the body and radially outward the plurality of supporting islands, wherein an upper surface of the substrate and an upper surface of the edge ring are disposed with a height difference between each other.

13. The top plate of claim 12, wherein the body comprises quartz.

14. The top plate of claim 12, wherein the edge surface is vertically lower than the upper surface of the substrate, and the height difference between the upper surface of the substrate and the edge surface is within a range from about 0.25 inch to about 0.5 inch.

15. The top plate of claim 12, wherein the substrate supporting surface is an upper surface of the continuous ring and the continuous ring has a diameter smaller than a diameter of the substrate.

16. The top plate of claim 12, wherein the body includes a plurality of pin holes configured to receive lifting pins.

17. The top plate of claim 12, wherein an inner surface of the edge ring surrounds outer surfaces of the plurality of the supporting islands.

* * * * *

UNITED STATES PATENT AND TRADEMARK OFFICE
CERTIFICATE OF CORRECTION

| | | |
|---|---|---|
| PATENT NO. | : 8,999,106 B2 | Page 1 of 1 |
| APPLICATION NO. | : 11/960300 | |
| DATED | : April 7, 2015 | |
| INVENTOR(S) | : Liu et al. | |

It is certified that error appears in the above-identified patent and that said Letters Patent is hereby corrected as shown below:

In the Claims:

Column 8, Claim 11, Line 42, please delete "dam" and insert --claim-- therefor.

Signed and Sealed this
Sixth Day of October, 2015

Michelle K. Lee
*Director of the United States Patent and Trademark Office*